United States Patent
Ivanov et al.

(10) Patent No.: US 7,745,892 B1
(45) Date of Patent: Jun. 29, 2010

(54) INTEGRATED MEMS SWITCH

(75) Inventors: Tony Ivanov, Summerfield, NC (US); Julio Costa, Summerfield, NC (US); Jonathan Hale Hammond, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 132 days.

(21) Appl. No.: 11/955,918

(22) Filed: Dec. 13, 2007

(51) Int. Cl.
*H01L 29/84* (2006.01)
(52) U.S. Cl. .............. 257/415; 257/414; 257/E21.481
(58) Field of Classification Search ................. 257/415, 257/E21.002, 678, 684; 438/51, 106
See application file for complete search history.

(56) References Cited

U.S. PATENT DOCUMENTS

| 7,135,766 | B1 | 11/2006 | Costa et al. |
| 2006/0012014 | A1* | 1/2006 | Chen et al. ................. 257/635 |
| 2006/0108675 | A1* | 5/2006 | Colgan et al. ............... 257/684 |
| 2007/0103028 | A1* | 5/2007 | Lewis et al. ................. 310/300 |
| 2007/0172975 | A1* | 7/2007 | Tomomatsu et al. ......... 438/52 |
| 2007/0281381 | A1* | 12/2007 | Ayazi ........................... 438/52 |
| 2008/0164542 | A1* | 7/2008 | Yang et al. .................. 257/415 |

OTHER PUBLICATIONS

Costa, J. et al., "Integrated MEMS Switch Technology on SOI-CMOS," Proceedings of Hilton Head Workshop 2008: A Solid-State Sensors, Actuators and Microsystems Workshop.

Costa, J. et al., "A Silicon RFCMOS SOI Technology for Integrated Cellular/WLAN RF TX Modules," Proceedings of the IEEE MTS Microwave Symposium, 2007, pp. 445-448, IEEE.

Guan, Lingpeng et al., "A Fully Integrated SOI RF MEMS Technology for System-on-a-Chip Applications," IEEE Transactions on Electron Devices, Jan. 2006, pp. 167-172, vol. 53, No. 1, IEEE.

Joseph, Alvin et al., "A 0.35 um SiGe BiCMOS Technology for Power Amplifier Applications," IEEE BCTM Conference Proceedings, 2007, pp. 198-201, IEEE.

Kelly, Dylan et al., "The State-of-the-Art of Silicon-on-Sapphire CMOS RF Switches," Proceedings of the IEEE Compound Semiconductor Symposium, 2005, pp. 200-205.

Mazure, Carlos et al., "Engineering Wafers for the Nanotechnology Era," Proceedings of ESSCIRC, 2005, pp. 29-38, IEEE.

(Continued)

*Primary Examiner*—Fernando L Toledo
*Assistant Examiner*—Mamadou Diallo
(74) *Attorney, Agent, or Firm*—Withrow & Terranova, PLLC

(57) ABSTRACT

The present invention provides a MEMS switch that is formed on, not merely placed on, a semiconductor substrate of a semiconductor device. The basic semiconductor substrate includes a handle wafer, an insulator layer over the handle wafer, and a device layer over the insulator layer. The device layer is one in which active semiconductor devices, such as transistors and diodes, may be formed. The MEMS switch is formed over the device layer during fabrication of the semiconductor device. Additional layers, such as connecting layers, passivation layers, and dielectric layers, may be inserted among or between any of these various layers without departing from the essence of the invention. As such, the present invention avoids the need to fabricate MEMS switches apart from the devices that contain circuitry to be associated with the MEMS switches, and to subsequently mount the MEMS switches to modules that circuitry.

21 Claims, 10 Drawing Sheets

OTHER PUBLICATIONS

Shokrani, Mohsen et al., "InGap-Plus(TM): A Low Cost Manufacturable GaAs BiFET Process Technology," Proceedings of the GaAs MANTECH Conference, 2006, pp. 153-156.

Tinella, C. et al., "0.13um CMOS SOI SP6T Antenna Switch for Multi-Standard Handsets," Topic Meeting on Silicon Monolithic Circuits in RF Systems, 2006, pp. 58-61, IEEE.

Tombak, Ali et al., "A Flip-Chip Silicon IPMOS Power Amplifier and a DC/DC Converter for GSM 850/900/1800/1900 MHz Systems," Proceedings of the IEEE Radio Frequency Integrated Circuits Symposium, 2007, pp. 79-82, IEEE.

Wohlmuth, Walter A. et al., "E-/D-pHEMT Technology for Wireless Components," Proceedings of the Compound Semiconductor Circuit Symposium, 2004, pp. 115-118, IEEE.

\* cited by examiner

US 7,745,892 B1

INTEGRATED MEMS SWITCH

FIELD OF THE INVENTION

The present invention relates to micro-electro-mechanical system (MEMS) switches, and in particular to forming a MEMS switch on a semiconductor substrate using a semiconductor fabrication process.

BACKGROUND OF THE INVENTION

As electronics evolve, there is an increased need for miniature switches that are provided on semiconductor substrates along with other semiconductor components to form various types of circuits. These miniature switches often act as relays, and are generally referred to as micro-electro-mechanical system (MEMS) switches. MEMS switches generally include a moveable portion such as a cantilever, which has a first end anchored to the semiconductor substrate, and a second free end having a cantilever contact. When the MEMS switch is activated, the cantilever moves the cantilever contact against a substrate contact on the semiconductor substrate and under the cantilever contact.

In many applications, numerous MEMS switches are required for a given circuit topology. For example, a radio frequency (RF) front-end section of a cellular telephone may have ten or more MEMS switches to aid in receiving, mixing, and transmitting various signals. Unfortunately, MEMS switches are generally formed as discrete components that reside alone or with other MEMS switches in a dedicated module. The circuitry employing the MEMS switches is generally formed on another semiconductor structure. The module or modules for the MEMS switches are mounted to the semiconductor structure to complete the circuitry that requires the MEMS switches. Thus, the MEMS switches are formed on discrete modules that are separate from the semiconductor structure that contains the circuitry associated with the MEMS switches.

By not being able to form the MEMS switches at the same time and using the same processes used to form the associated circuitry, the cost and size of modules containing the circuitry significantly increase. In addition to the time and effort required to mount the discrete MEMS switches to a particular semiconductor structure that contains the associated circuitry, the packaging required to protect the MEMS switches and connect the MEMS switches to the semiconductor structure often takes up significantly more space than the MEMS switches themselves.

Accordingly, there is a need for an effective and efficient way to form MEMS switches on a semiconductor structure along with the circuitry associated with the MEMS switches.

SUMMARY OF THE INVENTION

The present invention provides a MEMS switch that is formed on, not merely placed on, a semiconductor substrate of a semiconductor device. The basic semiconductor substrate may include a handle wafer, an insulator layer over the handle wafer, and a device layer over the insulator layer. The device layer is one in which active semiconductor devices, such as transistors and diodes, may be formed. The MEMS switch is formed over the device layer during or after fabrication of the semiconductor device. Additional layers, such as connecting layers, passivation layers, and dielectric layers, may be inserted among or between any of these various layers without departing from the essence of the invention. As such, the present invention avoids the need to fabricate MEMS switches on a different substrate from the devices that contain circuitry to be associated with the MEMS switches, and to subsequently mount the MEMS switches to modules that provide connectivity with the respective circuitry.

In a preferred embodiment, the device layer is made of silicon and active semiconductor devices are created in the device layer using a complementary metal oxide semiconductor (CMOS) fabrication process. As such, the semiconductor structure is effectively a silicon-on-insulator (SOI) configuration where a MEMS switch is formed over, if not directly on, the SOI substrate, which may take the form of an SOI wafer. The active semiconductor devices formed in the device layer may form circuitry that controls or includes the MEMS switch to facilitate desired functionality.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention provides a MEMS switch that is formed on, not merely placed on, a semiconductor substrate of a semiconductor device. The basic semiconductor substrate includes a handle wafer, an insulator layer over the handle wafer, and a device layer over the insulator layer. The device layer is one in which active semiconductor devices, such as transistors and diodes, may be formed. The MEMS switch is formed over the device layer during fabrication of the semiconductor device. Additional layers, such as connecting layers, passivation layers, and dielectric layers, may be inserted among or between any of these various layers without departing from the essence of the invention. As such, the present invention avoids the need to fabricate MEMS switches on a different substrate from the devices that contain circuitry to be associated with the MEMS switches, and to subsequently mount the MEMS switches to modules that may include circuitry.

In a preferred embodiment, the device layer is made of silicon and active devices are created in the device layer using a complementary metal oxide semiconductor (CMOS) fabrication process. As such, the semiconductor structure is effectively a silicon-on-insulator (SOI) configuration where a MEMS switch is formed over, if not directly on, the SOI substrate, which may take the form of an SOI wafer. The active semiconductor devices formed in the device layer may form circuitry that controls or includes the MEMS switch to facilitate desired functionality.

Figure 1A:
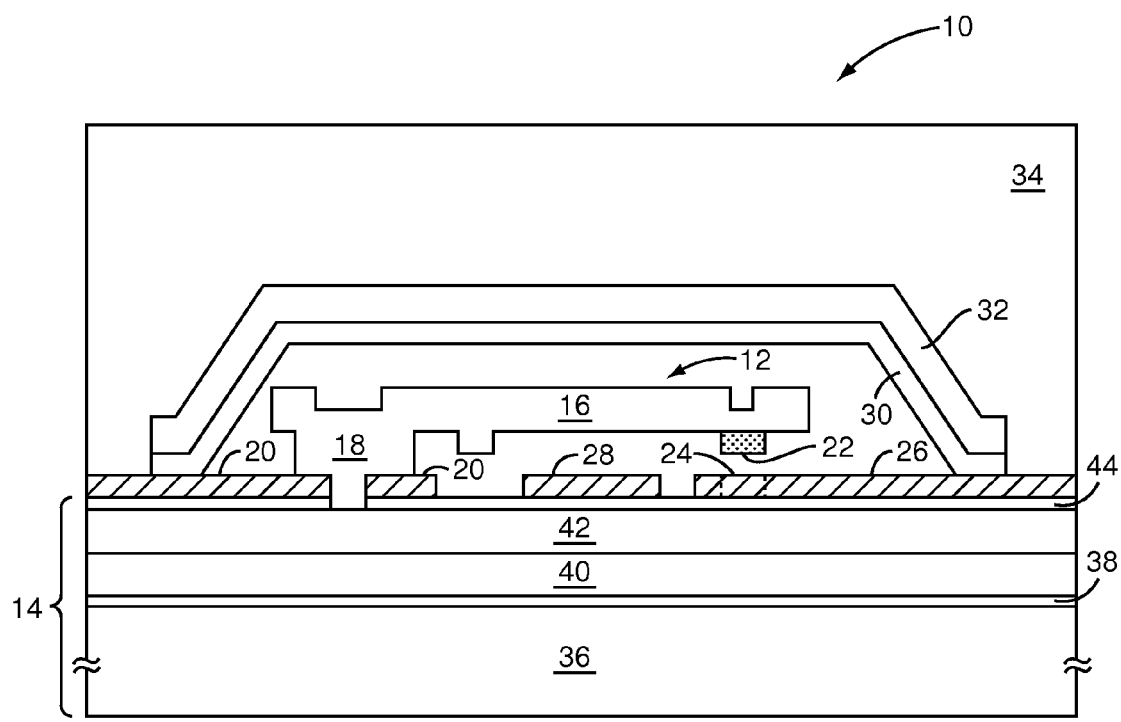
FIGS. 1A and 1B illustrate an exemplary micro-electromechanical system (MEMS) switch in an open and closed position, respectively.
Figure 1B:
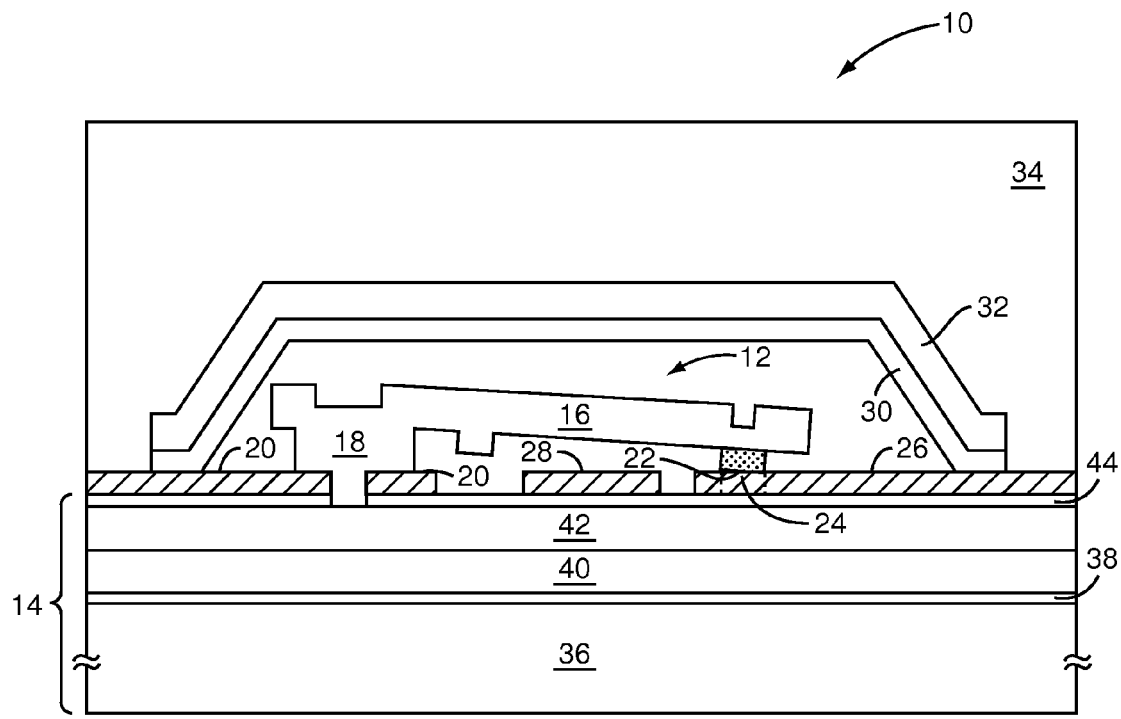

Turning to FIGS. 1A and 1B, a semiconductor device 10 having a MEMS switch 12 is illustrated according to one embodiment of the present invention. The MEMS switch 12 is effectively formed on a semiconductor substrate 14. The MEMS switch 12 includes a cantilever 16, which is formed from a conductive material, such as gold. The cantilever 16 has a first end and a second end. The first end is coupled to the semiconductor substrate 14 by an anchor 18. The first end of the cantilever 16 is also electrically coupled to a first conductive pad 20 at or near the point where the cantilever 16 is anchored to the semiconductor substrate 14. Notably, the first conductive pad 20 may play a role in anchoring the first end of the cantilever 16 to the semiconductor substrate 14 as depicted.

The second end of the cantilever 16 forms or is provided with a cantilever contact 22, which is suspended over a contact portion 24 of a second conductive pad 26. Thus, when the MEMS switch 12 is actuated, the cantilever 16 moves the cantilever contact 22 into electrical contact with the contact portion 24 of the second conductive pad 26 to electrically connect the first conductive pad 20 to the second conductive pad 26.

To actuate the MEMS switch 12, and in particular to cause the second end of the cantilever 16 to move the cantilever contact 22 into contact with the contact portion 24 of the second conductive pad 26, an actuator plate 28 is disposed over a portion of the semiconductor substrate 14 and under the middle portion of the cantilever 16. To actuate the MEMS switch 12, a potential difference is applied between the cantilever 16 and the actuator plate 28. The presence of this potential difference creates an electromagnetic field that effectively moves the second end of the cantilever 16 toward the actuator plate 28, thus changing the position of the cantilever 16 from the position illustrated in FIG. 1A to the position illustrated in FIG. 1B.

In the illustrated embodiment, the first conductive pad 20, the second conductive pad 26, and the actuator plate 28 are formed from a single metallic or conductive layer, such as gold, copper, platinum, or the like. The particular form factor for the first conductive pad 20, second conductive pad 26, and actuator plate 28 is provided through an etching or other patterning technique. With continued reference to FIGS. 1A and 1B, the MEMS switch 12 may be encapsulated by one or more encapsulating layers 30 and 32, which form a substantially hermetically sealed cavity about the cantilever 16. The cavity is generally filled with an inert gas. Once the encapsulation layers 30 and 32 are in place and any other semiconductor components are formed on the semiconductor substrate 14, a plastic overmold 34 may be provided over the encapsulation layers 30 and 32 and any other semiconductor components.

With continued reference to FIGS. 1A and 1B, the substrate 14 is preferably formed using a semiconductor-on-insulator process, such as a silicon- or sapphire-on-insulator process. In particular, the substrate 14 includes a handle wafer 36 that is formed from silicon, sapphire, glass, or like material to form a foundation layer for the semiconductor device 10. In the illustrated embodiment, the handle wafer 36 is approximately a few hundred microns thick. An insulator layer 38 is formed over the handle wafer 36. The insulator layer 38 is generally formed from an oxide, such as Silicon Dioxide ($SiO_2$), which may range in thickness from 0.1 to 2 microns in the preferred embodiment. A device layer 40, which may include one or more layers, is formed using an appropriate semiconductor material.

The device layer 40 is the layer or layers in which active semiconductor devices, such as transistors and diodes that employ PN junctions, are formed. The device layer 40 is initially formed as a base semiconductor layer that is subsequently doped with N-type and P-type materials to form the active semiconductor devices. Thus, the active semiconductor devices, except for any necessary contacts or connections traces, are generally contained within the device layer 40. Those skilled in the art will recognize various techniques for forming active semiconductor devices in the device layer 40. A metal-dielectric stack 42 is formed over the device layer 40, wherein a plurality of metal and dielectric layers are alternated to facilitate connection with and between the active devices formed in the device layer 40. Further, in the preferred embodiment the handle wafer 36 is made of a high-resistivity semiconductor material where resistance is greater than 50 ohm-cm.

With the present invention, active semiconductor devices may be formed in the device layer 40 and connected to one another via the metal-dielectric stack 42 directly underneath the MEMS switch 12. Since the device layer 40 resides over the insulator layer 38, high voltage devices, which may exceed ten (10) volts in operation, may be formed directly under the MEMS switch 12 and connected in a way to control operation of the MEMS switch 12 or associated circuitry. Although silicon is described in the preferred embodiment, the semiconductor material for the device layer 40 may include gallium arsenide (GaAs), gallium nitride (GaN), indium phosphide (InP), silicon germanium (SiGe), sapphire, and like semiconductor materials. For the preferred embodiment, the device layer 40 ranges in thickness from 0.1 microns to 20 or more microns.

As illustrated in FIGS. 1A and 1B, a passivation layer 44 may be provided over the metal-dielectric stack 42, and in a CMOS process, represents the end of the CMOS process. The metal layer used to form the first conductive pad 20, second conductive pad 26, and actuator plate 28 may be formed over the passivation layer 44 and etched to form the respective ones of the first conductive pad 20, the second conductive pad 26, and the actuator plate 28.

Figure 2:
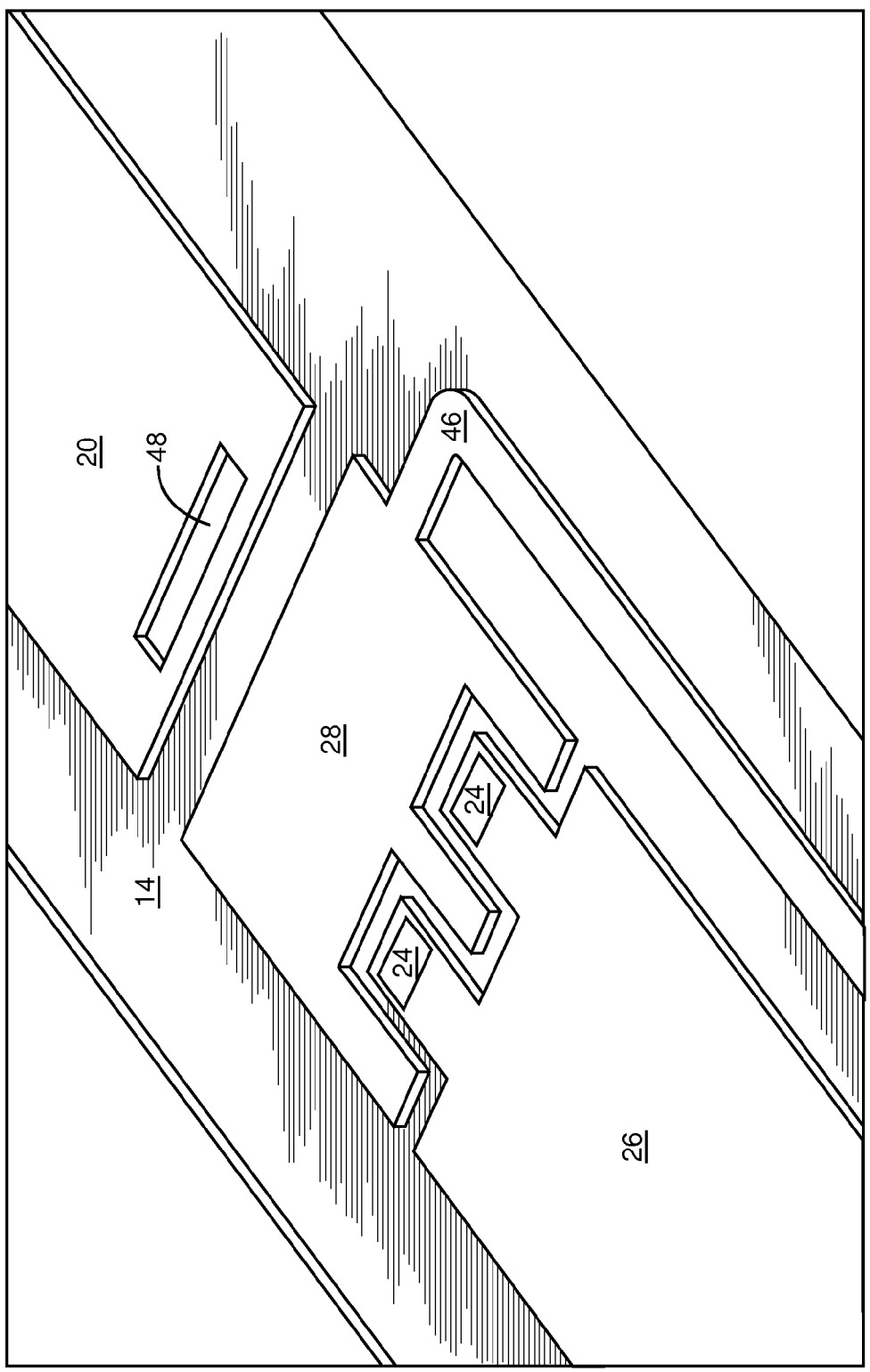
FIG. 2 is a perspective view of a portion of a MEMS switch without a cantilever.

With reference to FIG. 2, a perspective view of a portion of a MEMS switch 12 is provided to more clearly illustrate an exemplary configuration of the MEMS switch 12. The cantilever 16 is not illustrated in order to better depict the first conductive pad 20, the second conductive pad 26, the actuator plate 28, and the contact portions 24 of the second conductive pad 26. Also illustrated is an actuator control path 46, which provides an electrical path to present an electrostatic voltage to the actuator plate 28. An anchor trench 48 is also illustrated according to one embodiment of the present invention. The anchor trench 48 forms a recess where the cantilever 16 is anchored to the semiconductor substrate 14, directly or indirectly through the first conductive pad 20.

Figure 3:
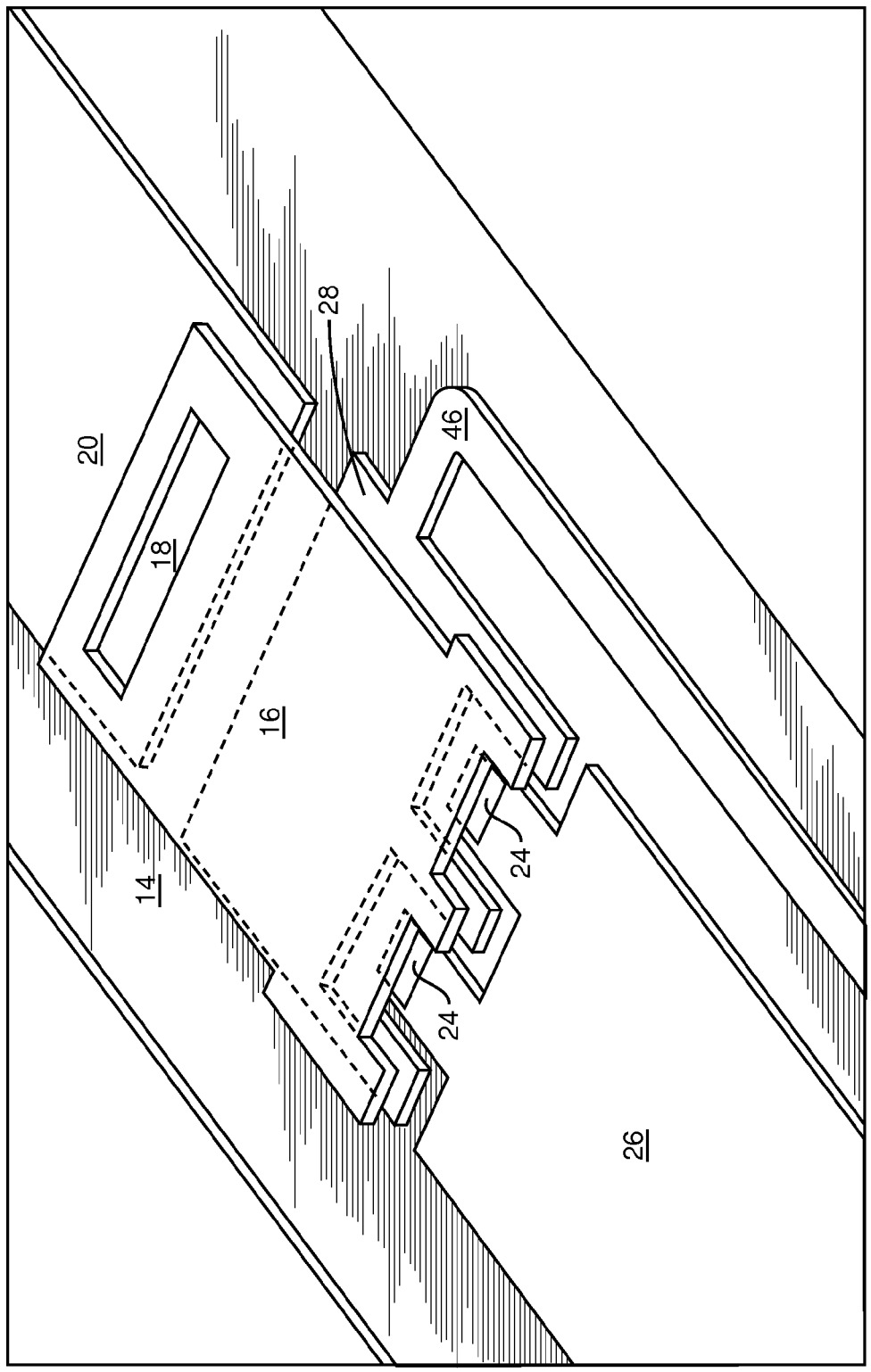
FIG. 3 is a perspective view of a MEMS switch with a cantilever.

With reference to FIG. 3, the MEMS switch 12 of FIG. 2 is illustrated with the cantilever 16. Notably, the cantilever 16 is affixed to the first conductive pad 20 by the anchor 18 and the anchor trench 48. Further, the cantilever 16 extends over the actuator plate 28 as well as the contact portions 24 of the second conductive pad 26. When the MEMS switch 12 is not actuated, the cantilever 16 remains suspended over the contact portions 24 of the second conductive pad 26.

Figure 4:
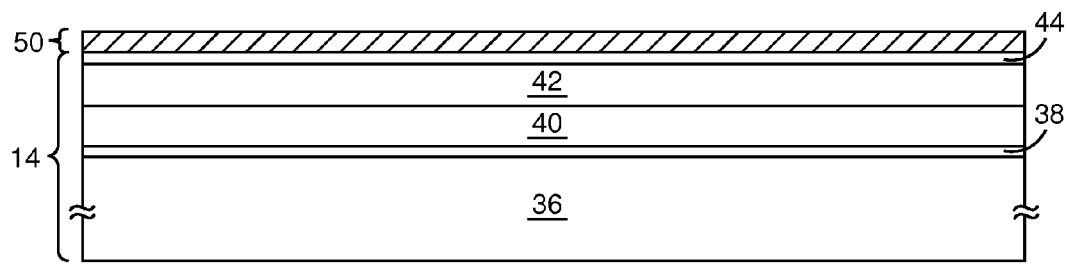
FIGS. 4-15 illustrate successive steps during a semiconductor fabrication process for constructing a semiconductor device having an integrated MEMS switch according to one embodiment of the present invention.

Turning now to FIGS. 4-15, an exemplary process for forming the semiconductor device 10 of FIGS. 1A and 1B is provided. As depicted in FIG. 4, the semiconductor substrate 14, which includes the handle wafer 36, insulator layer 38, device layer 40, metal-dielectric stack 42, and passivation layer 44 is provided, wherein any active devices to be provided underneath the MEMS switch 12 are already created in the device layer 40 and the contacts with these active devices and interconnections between these active devices are formed in the metal-dielectric stack 42. Over the passivation layer 44, an interconnect layer 50 is provided.

Figure 5:
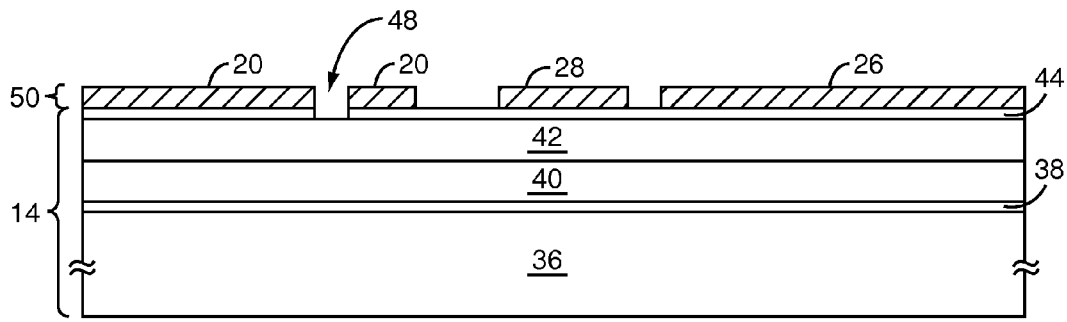

The interconnect layer 50 is etched to form the first conductive pad 20, the second conductive pad 26, and the actuator plate 28, as shown in FIG. 5. The interconnect layer 50 may also provide various traces to other circuitry that is formed on or in the substrate 14, including the active devices that are formed underneath the MEMS switch 12. Notably, the trench 48 is provided in the first conductive pad 20 to connect MEMS switch 12 to underlying metal-dielectric stack 42 and active semiconductor devices in device layer 40.

Figure 6:
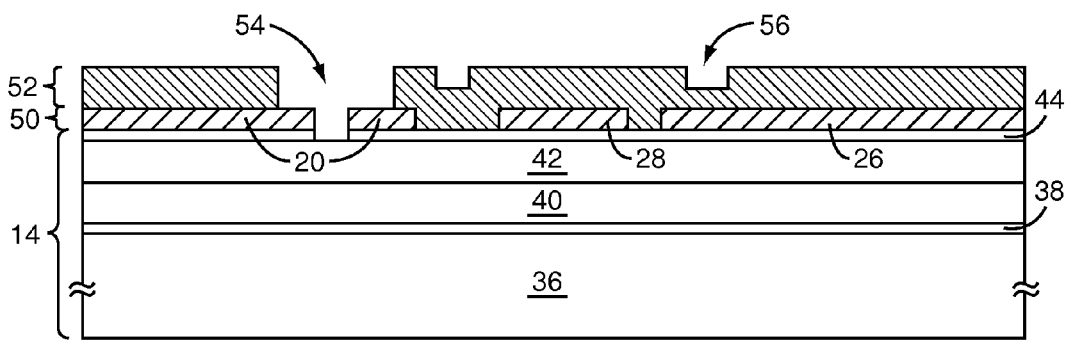
Figure 7:
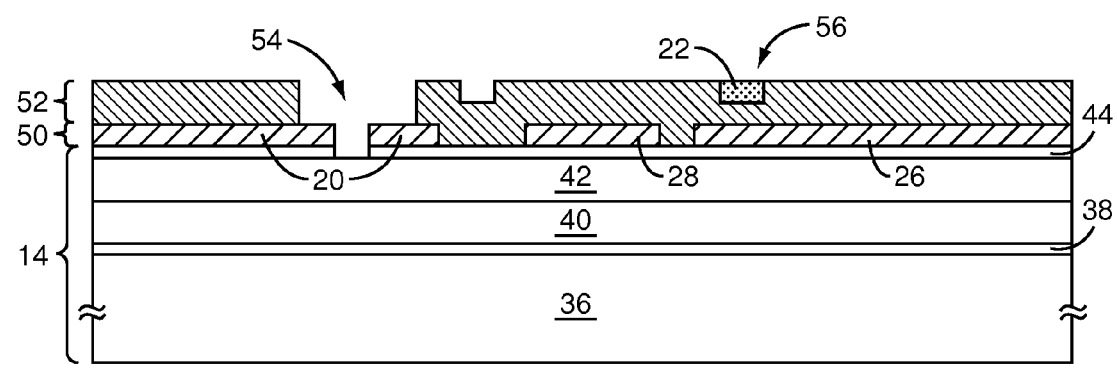

With reference to FIG. 6, a first sacrificial layer 52 is formed and patterned over the first conductive pad 20, second conductive pad 26, the actuator plate 28, and the exposed portions of the passivation layer 44. Again, with reference to FIG. 6, the first sacrificial layer 52 is patterned to provide a mold for the anchor 18 and the cantilever contact 22. As illustrated, an anchor opening 54 for the anchor 18 and a contact opening 56 for the cantilever contact 22 are depicted. Next, with reference to FIG. 7, the cantilever contact 22 is formed in the contact opening 56. The cantilever contact 22 may be formed from various materials, such as gold, platinum, alloys, or the like.

Figure 8:
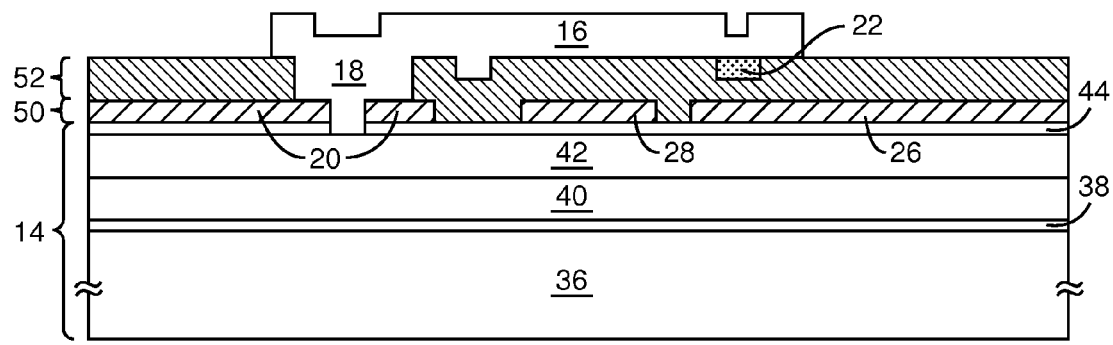
Figure 9:
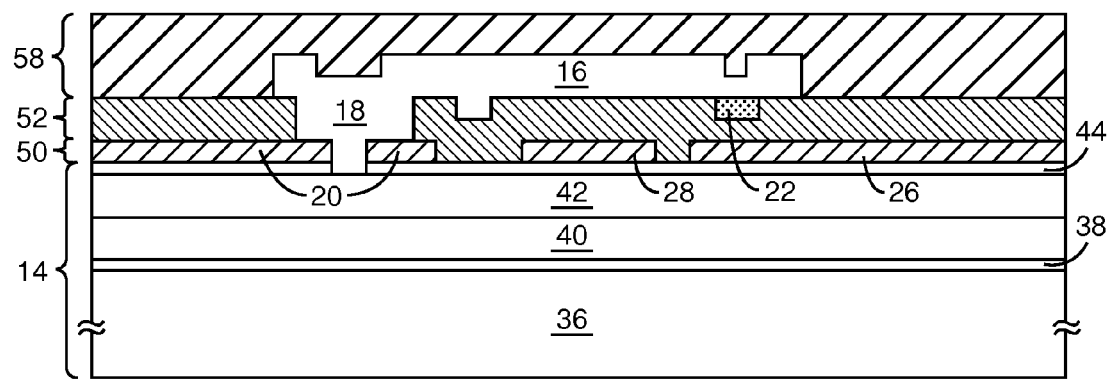

As illustrated in FIG. 8, a cantilever layer is formed over the first sacrificial layer 52 and etched to form the anchor 18 and cantilever 16 for the MEMS switch 12. Notably, the cantilever contact 22 connects to the cantilever 16, and may be the same or different material as the cantilever 16. Once the anchor 18 and cantilever 16 for the MEMS switch 12 are formed, a second sacrificial layer 58 is formed over the first sacrificial layer 52 and the anchor 18 and cantilever 16 of the MEMS switch 12, as illustrated in FIG. 9.

Figure 10:
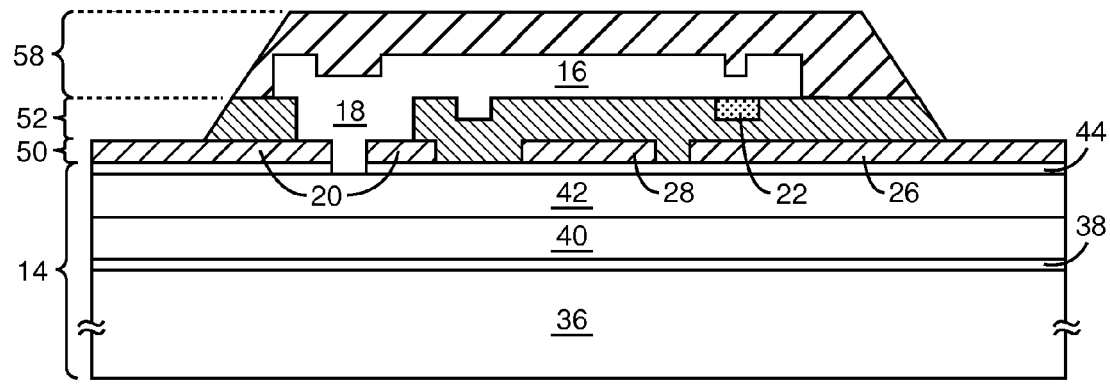

FIGS. 10-14 illustrate a technique for creating a cavity in which the anchor 18 and cantilever 16 of the MEMS switch 12 are formed. With particular reference to FIG. 10, the first and second sacrificial layers 52, 58 are patterned, wherein the remaining portions of the first and second sacrificial layers 52, 58 form the overall shape of the cavity to be formed around the anchor 18 and the cantilever 16 of the MEMS switch 12.

Figure 11:
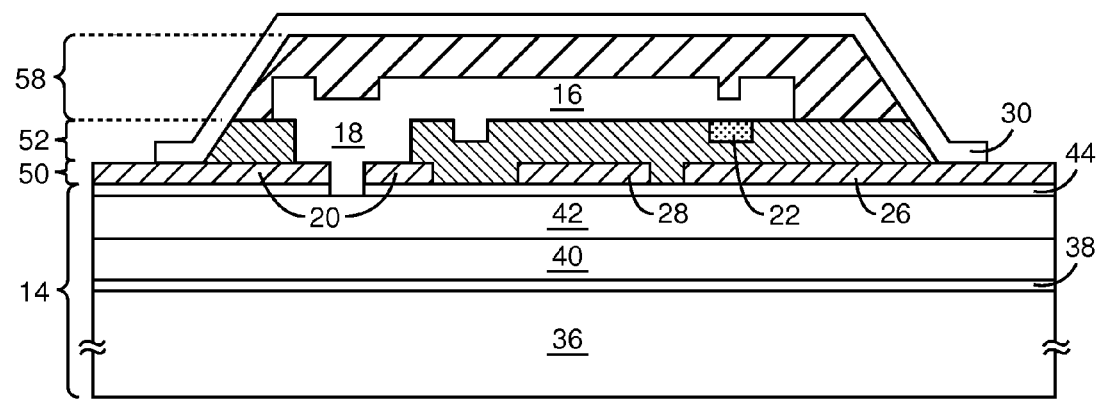
Figure 12:
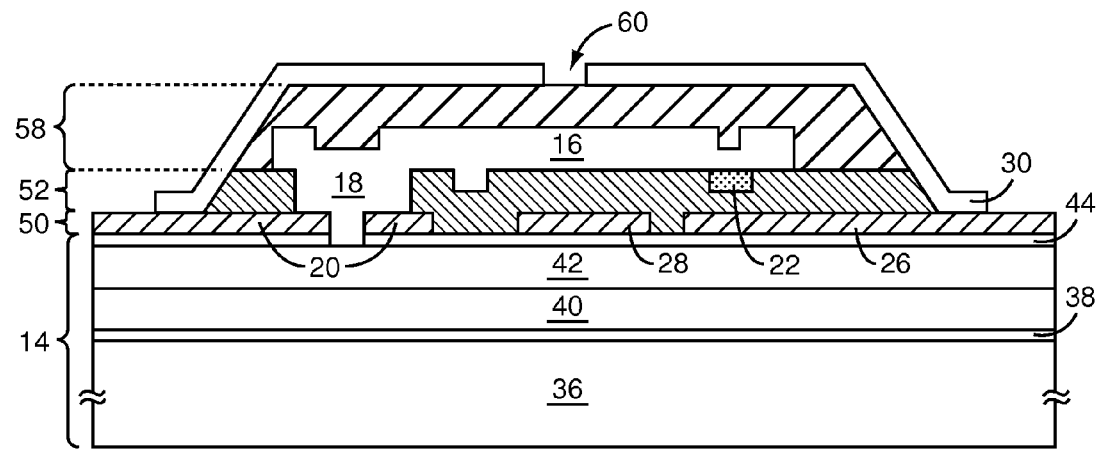
Figure 13:
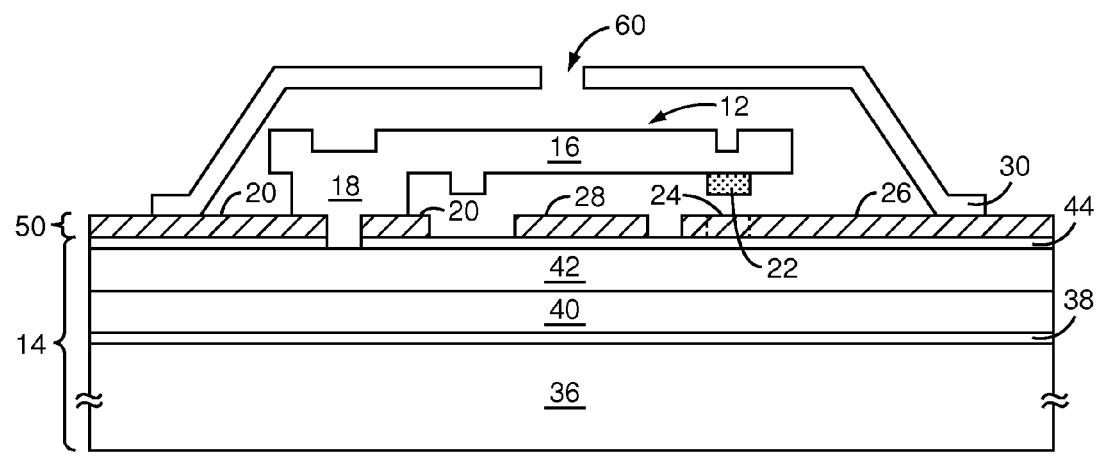

Once the first and second sacrificial layers 52, 58 are patterned to form a cavity mold, a first encapsulation layer 30 is formed over the first and second sacrificial layers 52, 58, as shown in FIG. 11. A release hole 60 is then etched thru the first encapsulation layer 30 to expose the remaining portion of the second sacrificial layer 58, as illustrated in FIG. 12. Next, the remaining portions of the first and second sacrificial layers 52, 58, which are within the first encapsulation layer 30, are removed using an appropriate etching process or the like, as illustrated in FIG. 13. At this point, the cantilever 16 of the MEMS switch 12 is anchored to the substrate 14 via the anchor 18, and suspended in a cavity formed underneath the first encapsulation layer 30 and above the substrate 14. Notably, the portion of the first sacrificial layer 52 that was underneath the cantilever 16 is removed, such that the cantilever 16 may deflect and thus move toward the substrate 14 when the MEMS switch 12 is actuated, to allow the cantilever contact 22 to come into contact with the contact portion 24 of the second conductive pad 26.

Figure 14:
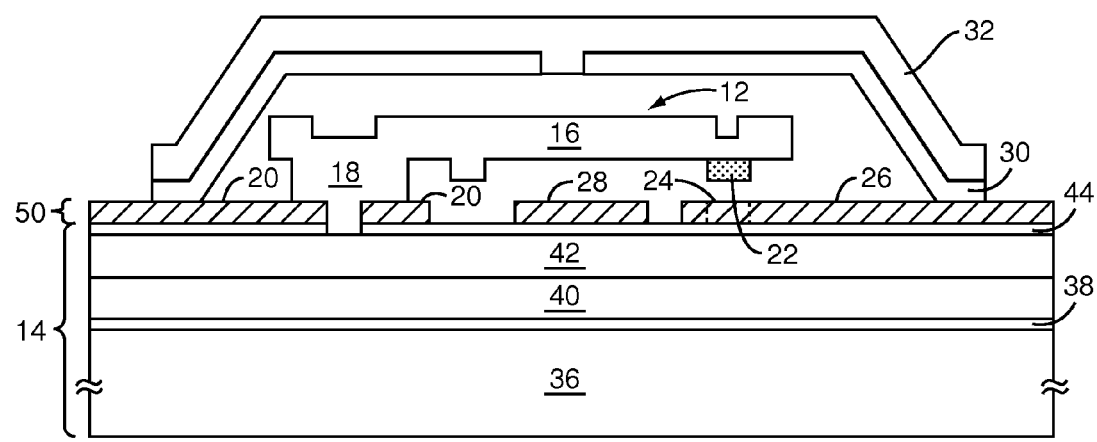
Figure 15:
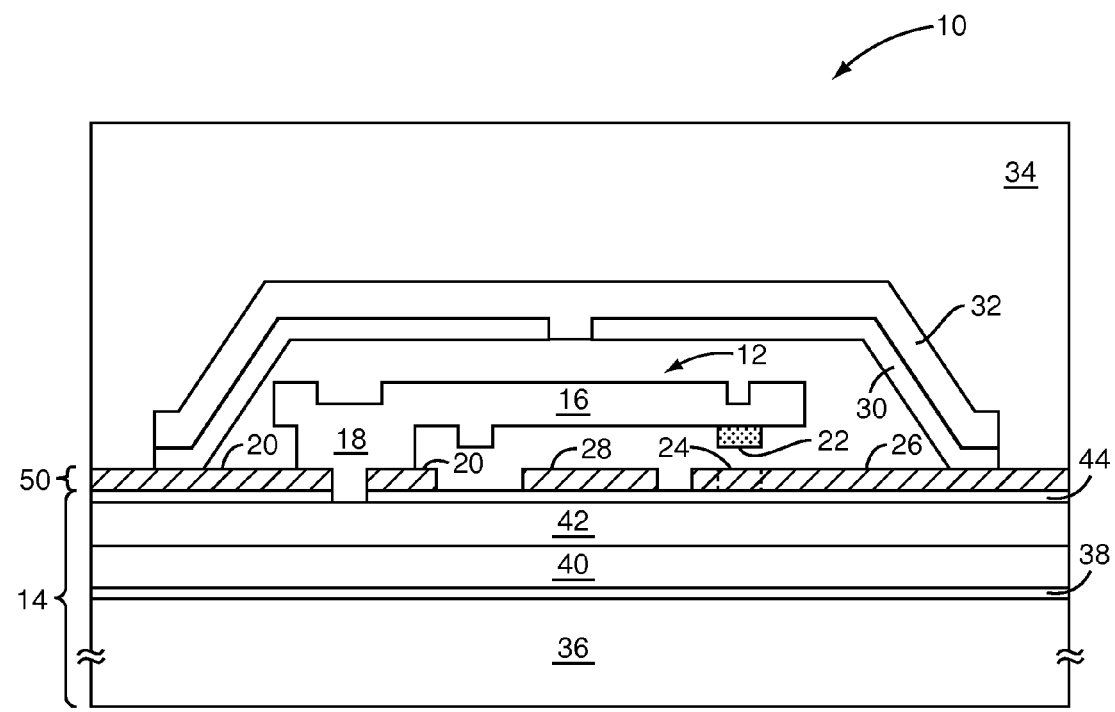

The cavity formed as a result of the removal of the remaining portions of the first and second sacrificial layers 52, 58 may be filled with an inert gas during the fabrication process. In one embodiment, the chamber in which the semiconductor device is being formed is filled with the inert gas, and subsequently, a second encapsulation layer 32 is formed over the first encapsulation layer 30, as illustrated in FIG. 14. The second encapsulation layer 32 provides further structural rigidity to the dome formed over the MEMS switch 12, as well as sealing the release hole 60 that was created in the first encapsulation layer 30. Thus, the inert gas is trapped in the cavity formed by the first and second encapsulation layers 30, 32. Finally, an overmold 34 is provided over the exposed portions of the substrate 14, and in particular over the second encapsulation layer 32, as shown in FIG. 15. Any number of encapsulation layers may be used to ensure that the overmold process used to put the overmold 34 over the substrate 14 does not destroy the dome formed by the first and second encapsulation layers 30, 32.

Figure 16:
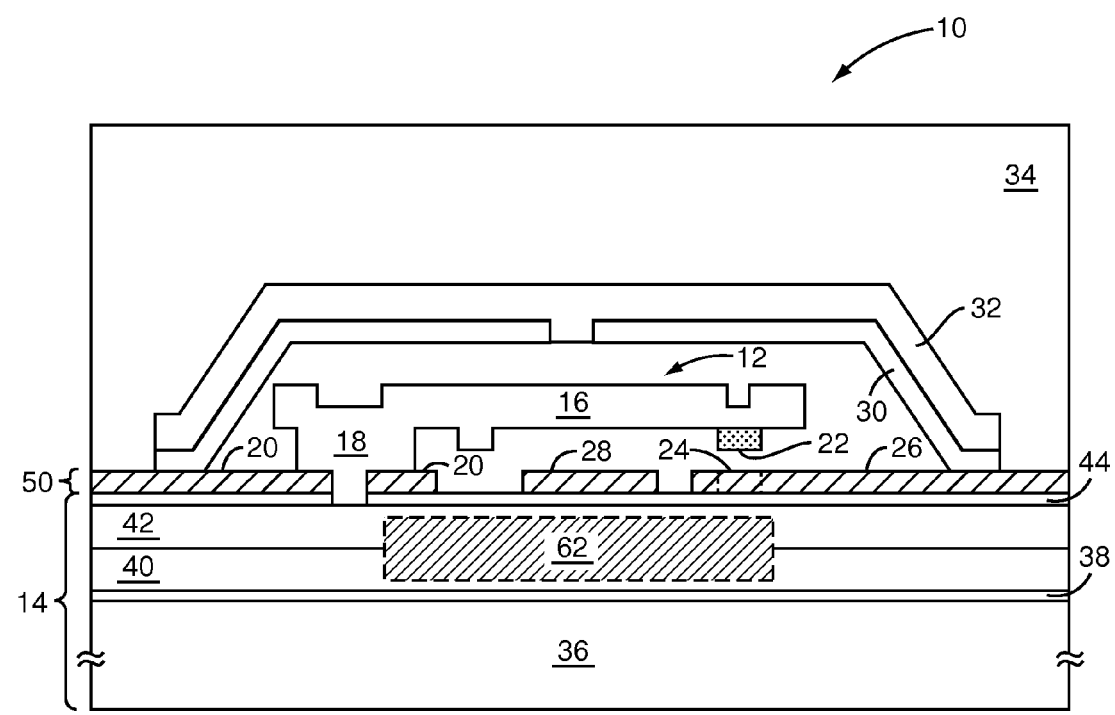
FIG. 16 is a block representation of a second embodiment of a MEMS switch integrated into a semiconductor device.

With reference to FIG. 16, various active components, contacts for these components, and interconnects between these components may be formed in the device layer 40 and the metal-dielectric stack 42 to form electronic circuitry 62, which resides directly underneath the MEMS switch 12, and in particular, underneath the cantilever 16 or the space formed by the first and second encapsulation layers 30, 32. The electronic circuitry 62 may be used to control the MEMS switch 12 or otherwise connect to the MEMS switch 12 via the first conductive pad 20, second conductive pad 26, actuator plate 28, connecting trenches 48 or any combination thereof. Thus, the electronic circuitry 62 may provide or receive signals that pass through the MEMS switch 12 when the MEMS switch 12 is actuated, or drive the actuator plate 28 to control operation of the MEMS switch 12.

Figure 17:
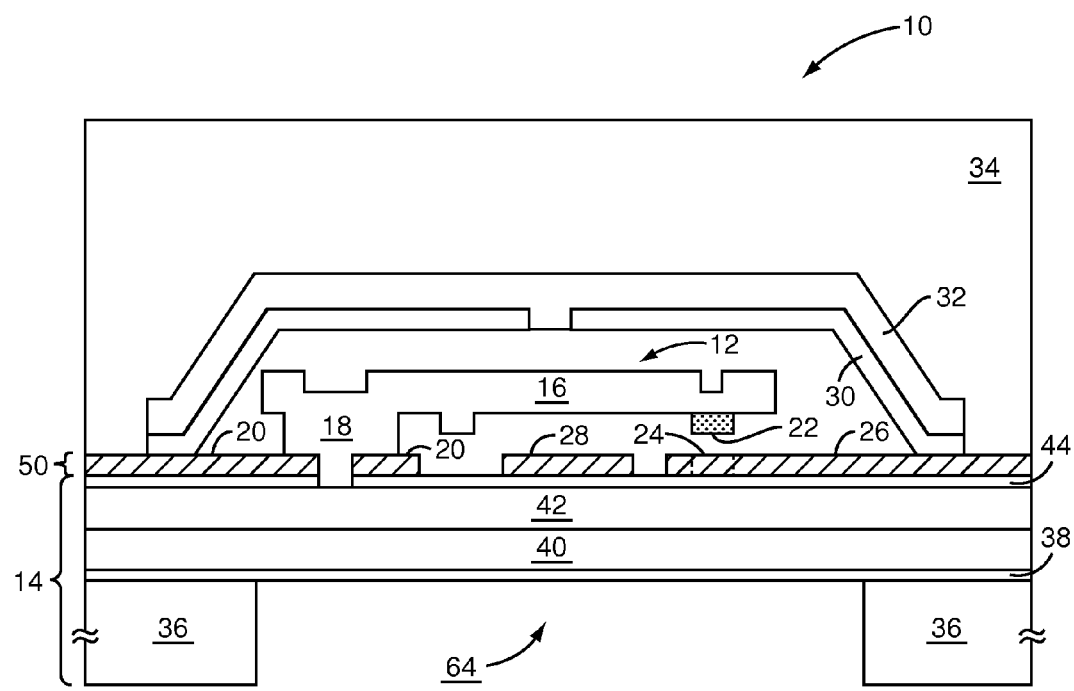
FIG. 17 is a block representation of a third embodiment of a MEMS switch integrated into a semiconductor device.

With reference to FIG. 17, all or a portion of the substrate 14 that resides underneath the MEMS switch 12 may be removed to improve operation, and thus electrical performance, of the MEMS switch 12. As illustrated, a cored portion 64 is removed from the handle wafer 36 beneath the MEMS switch 12. The insulated layer 38 remains intact in this example; however, those skilled in the art will recognize that a portion of the handle wafer 36 may also remain intact underneath the MEMS switch 12. Alternatively, all or a portion of the insulator layer 38, and perhaps the device layer 40, may be removed as part of the cored portion 64. The size and shape of the cored portion 64 may be varied to obtain certain performance criteria for the MEMS switch 12.

Figure 18:
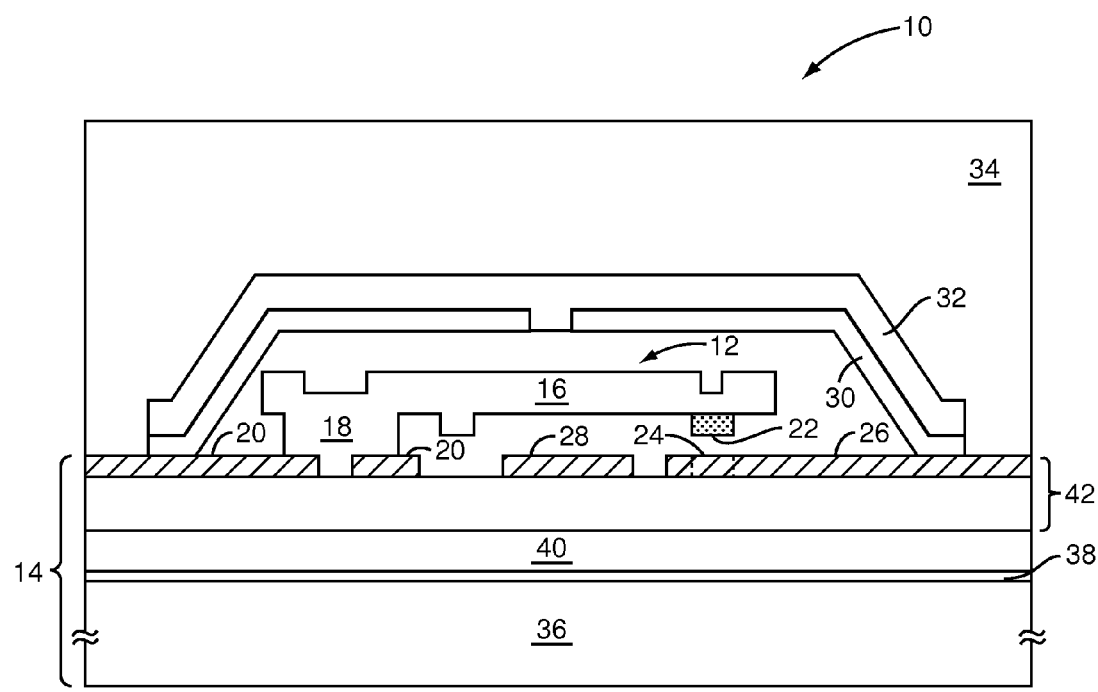
FIG. 18 is a block representation of a fourth embodiment of a MEMS switch integrated into a semiconductor device.

With reference to FIG. 18, the MEMS switch 12 may be formed directly on the metal-dielectric stack 42 prior to the passivation layer 44 being formed. As such, the first conductive pad 20, second conductive pad 26, and the actuator plate 28 may be formed from the top metal layer that is part of the metal-dielectric stack 42, which is part of a standard CMOS process.

Those skilled in the art will recognize improvements and modifications to the preferred embodiments of the present invention. All such improvements and modifications are considered within the scope of the concepts disclosed herein and the claims that follow.

What is claimed is:

1. A semiconductor device comprising: a substrate comprising a handle layer, an insulator layer over the handle layer, and a device layer over the handle layer in which a plurality of active semiconductor devices are formed, such that at least one of the plurality of active semiconductor devices and the MEMS switch form an electrical circuit, which controls operation of the MEMS switch; and a micro-electro-mechanical system (MEMS) switch integrally formed on the substrate, such that the MEMS switch comprises:
 a substrate contact formed on the substrate;
 a cantilever comprising a body, a first end anchored to the substrate, and a second end providing a cantilever contact suspended over the substrate contact; and
 an actuator plate on the semiconductor substrate and adjacent to the body of the cantilever.

2. The semiconductor device of claim 1 wherein at least one of the plurality of active semiconductor devices is formed directly underneath the MEMS switch in the device layer of the substrate.

3. The semiconductor device of claim 1 wherein the MEMS switch provides a switch in the electrical circuit.

4. The semiconductor device of claim 1 wherein the substrate further comprises a metal-dielectric stack of at least one conducting layer and at least one dielectric layer over the device layer, wherein the at least one conducting layer forms at least one of a group consisting of a contact for at least one of the plurality of active semiconductor devices and a connection to or from the at least one of the plurality of active semiconductor devices.

5. The semiconductor device of claim 4 wherein the substrate further comprises a passivation layer over the metal-dielectric stack.

6. The semiconductor device of claim 1 wherein the MEMS switch comprises:
 a substrate contact formed on the substrate;
 a cantilever comprising a body, a first end anchored to the substrate, and a second end providing a cantilever contact suspended over the substrate contact; and
 an actuator plate on the semiconductor substrate and adjacent to the body of the cantilever.

7. The semiconductor device of claim 1 wherein the substrate contact and the actuator plate are formed on a passivation layer of the substrate.

8. The semiconductor device of claim 1 wherein the substrate contact and the actuator plate are formed from an interconnect layer formed over the substrate.

9. The semiconductor device of claim 1 wherein the substrate contact and the actuator plate are formed from a metal layer of a metal-dielectric stack formed over the device layer of the substrate.

10. The semiconductor of claim 1 further comprising an encapsulation structure forming an enclosure about the substrate contact, cantilever, and actuator plate.

11. The semiconductor of claim 10 wherein a space encapsulated by the enclosure is filled with an inert gas.

12. The semiconductor device of claim 1 wherein the device layer comprises silicon and the plurality of active semiconductor devices are formed using a complementary metal oxide semiconductor (CMOS) fabrication process.

13. The semiconductor device of claim 1 wherein the device layer comprises silicon and the device layer, insulator, and handle layer form a silicon-on-insulator semiconductor structure.

14. The semiconductor device of claim 1 wherein the device layer comprises silicon and the device layer, insulator, and handle layer form a sapphire-on-insulator semiconductor structure.

15. The semiconductor device of claim 1 wherein a portion of the handle layer below the MEMS switch is removed.

16. The semiconductor device of claim 1 further comprising an overmold covering the MEMS switch and the substrate, wherein an integrated module comprising the plurality of active semiconductor devices and the MEMS switch is formed.

17. The semiconductor device of claim 1 further comprising:
 a multilayer encapsulation structure forming an enclosure about the substrate contact, cantilever, and actuator plate wherein a space encapsulated by the enclosure is filled with an inert gas; and
 an overmold covering the MEMS switch and the substrate, wherein an integrated module comprising the plurality of active semiconductor devices and the MEMS switch is formed and the MEMS switch comprises:
 a substrate contact formed on the substrate;
 a cantilever comprising a body, a first end anchored to the substrate, and a second end providing a cantilever contact suspended over the substrate contact; and
 an actuator plate on the semiconductor substrate and adjacent to the body of the cantilever.

18. The semiconductor device of claim 1 wherein the electrical circuit provides a signal to drive an actuator plate of the MEMS switch to control operation of the MEMS switch.

19. A semiconductor device comprising:
 a substrate comprising a handle layer, an insulator layer over the handle layer, a device layer over the handle layer, and a passivation layer over the device layer, such that a plurality of active semiconductor devices are formed in the substrate and at least one of the plurality of active semiconductor devices and the MEMS switch form an electrical circuit, which controls operation of the MEMS switch; and
 a micro-electro-mechanical system (MEMS) switch integrally formed on the substrate and comprising:
 a substrate contact formed on the passivation layer;
 a cantilever comprising a body, a first end anchored to the substrate, and a second end providing a cantilever contact suspended over the substrate contact; and
 an actuator plate on the passivation layer and adjacent to the body of the cantilever.

20. The semiconductor device of claim 19 wherein at least one of the plurality of active semiconductor devices and the MEMS switch form an electrical circuit, which controls operation of the MEMS switch.

21. The semiconductor device of claim 20 wherein the electrical circuit provides a signal to drive the actuator plate of the MEMS switch to control operation of the MEMS switch.

* * * * *